US006608323B2

(12) United States Patent  (10) Patent No.: US 6,608,323 B2
Marks et al.  (45) Date of Patent: Aug. 19, 2003

(54) N-TYPE THIOPHENE SEMICONDUCTORS

(75) Inventors: Tobin J. Marks, Evanston, IL (US);
Antonio Facchetti, Chicago, IL (US);
Henning Sirringhaus, Cambridge
(GB); Richard H. Friend, Cambridge
(GB)

(73) Assignees: Northwestern University, Evanston, IL
(US); **Cambridge Univ. Technical
Services, Ltd.**, Cambridge (GB)

( * ) Notice: Subject to any disclaimer, the term of this patent is extended or adjusted under 35 U.S.C. 154(b) by 0 days.

(21) Appl. No.: 09/915,210

(22) Filed: Jul. 24, 2001

(65) Prior Publication Data

US 2002/0053666 A1 May 9, 2002

Related U.S. Application Data

(60) Provisional application No. 60/220,601, filed on Jul. 24, 2000.

(51) Int. Cl.$^7$ ............................. H01L 35/24; H01L 51/00
(52) U.S. Cl. ................................... 257/40; 257/213
(58) Field of Search ........................... 257/40, 213

(56) References Cited

U.S. PATENT DOCUMENTS

| 5,107,308 A | * | 4/1992 | Koezuka et al. | 257/40 |
| 5,546,889 A | | 8/1996 | Wakita et al. | 117/84 |
| 5,792,557 A | | 8/1998 | Nakaya et al. | 428/411.1 |
| 5,945,502 A | | 8/1999 | Hsieh et al. | 528/101 |
| 6,074,734 A | | 6/2000 | Kawamura et al. | 428/220 |
| 6,136,702 A | | 10/2000 | Chandross et al. | 438/678 |
| 6,331,356 B1 | * | 12/2001 | Angelopoulos et al. | 428/411.1 |

FOREIGN PATENT DOCUMENTS

WO    WO 99/54936    10/1999

* cited by examiner

Primary Examiner—Hoai Ho
Assistant Examiner—Tu-Tu Ho
(74) Attorney, Agent, or Firm—Reinhart Boerner Van Deuren, SC

(57) ABSTRACT

The new fluorocarbon-functionalized polythiophenes, in particular, α,ω-diperfluorohexylsexithiophene DFH-6T (1) can be straightforwardly prepared in high yield and purified by gradient sublimation. Introduction of perfluorocarbon chains on the thiophene core affords enhanced thermal stability and volatility, and increased electron affinity versus the fluorine-free analog 2. Evaporated films of 1, for example, behave as n-type semiconductors, and can be used to fabricate thin film transistors with FET mobilities on the order of ~0.01 cm$^2$/Vs—some of the highest reported to date for n-type organic semiconductors.

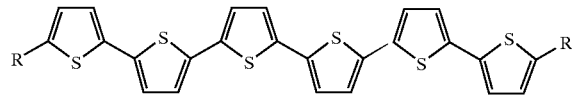

DFH-6T (1), R = $^nC_6F_{13}$
DH-6T (2), R = $^nC_6H_{13}$
6T (3), R = H

32 Claims, 8 Drawing Sheets

A)

B)

A)

B)

A)

B)

C)

A)

B)

N-TYPE THIOPHENE SEMICONDUCTORS

This application claims the benefit of prior provisional patent application No. 60/220,601, filed Jul. 24, 2000 the entirety of which is incorporated herein by reference.

The United States Government has rights in this invention pursuant to Grant No. N00421-98-1187 from DARPA and the NSF-MRSEC program (DMR-9632472) to Northwestern University.

BACKGROUND OF THE INVENTION

Thiophene chemistry and the chemical stability of the thiophene ring hold potential for use of thiophene materials in molecular-based electronics and photonics. In particular, αα'-conjugated thiophene oligomers (nTs) and polymers (polythiophenes—PTs have attracted great interest as semiconducting elements in organic thin-film transistors (TFTs).[1,2] To be useful in such devices and related structures,

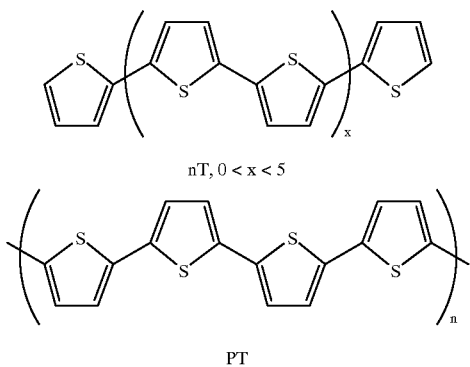

the organic material must support a channel of holes or electrons (p- or n-type semiconductor, respectively) created by the gate electrode bias, which switches the device "on". Furthermore, the charge mobility of the material must be sufficiently large to increase the source-drain on-conduction by many orders of magnitude over the "off" state. The density of the charge carrier in the channel is modulated by voltage applied at the gate electrode.

To date, the most noteworthy examples of this family of compounds are unsubstituted, α,ω- and β,β'-dialkylsubstituted nT (n=4,6), and β-alkylsubstituted PT, where optimized carrier mobilities (0.1–0.6 cm$^2$ V$^{-1}$ s$^{-1}$) and on/off ratios (>10$^6$) approach those of amorphous silicon.[1e,2a,c,e,3] However, without exception, these systems facilitate hole injection and behave as p-type semiconductors, presumably because the thiophene electron-richness renders negative carriers susceptible to trapping by residual impurities such as oxygen[4]. Even so, increasing the number of thiophene units decreases dramatically environmental (air, light) stability and causes processing and purification difficulties.

Electron transporting (n-type) organic materials are relatively rare.[8] However, developing/understanding new n-type materials would enable applications[5] such as bipolar transistors, p-n junction diodes, and complementary circuits as well as afford better fundamental understanding of charge transport in molecular solids. The major barrier to progress however, is that most n-type organics are either environmentally sensitive, have relatively low field mobilities, lack volatility for efficient film growth, and/or are difficult to synthesize.[5e,6,7]

As indicated by the foregoing notations, these and other aspects of and teachings of the prior art can be found in the following:

[1] (a) G. Horowitz, F. Kouki, A. El Kassmi, P. Valat, V. Wintgens, F. Garnier, Adv. Mater. 1999, 11, 234. (b) F. Garnier, R. Hajaoui, A. El Kassmi, G. Horowitz, L. Laigre, W. Porzio, M. Armanini, F. Provasoli, Chem. Mater. 1998, 10, 3334. (c) X. C. Li, H. Sirringhaus, F. Garnier, A. B. Holmes, S. C. Moratti, N. Feeder, W. Clegg, S. J. Teat, R. H. Friend, J. Am. Chem. Soc. 1998, 120, 2206. (d) G. Horowitz, F. Kouki, F. Garnier, Adv. Mater. 1998, 10, 382. (e) L. Antolini, G. Horowitz, F. Kouki, F. Garnier, Adv. Mater. 1998. 10, 381. (f) G. Horowitz, Adv. Mater. 1998, 10, 365.

[2] (a) W. Li, H. E. Katz, A. J. Lovinger, J. G. Laquindanum, Chem. Mater. 1999, 11, 458. (b) H. E. Katz, J. G. Laquindanum, A. J. Lovinger, Chem. Mater. 1998, 10, 633. (c) J. G. Laquindanum, H. E. Katz, A. J. Lovinger, J. Am. Chem. Soc. 1998, 120, 664. (d) T. Siegrist, C. Kloc, R. A. Laudise, H. E. Katz, R. C. Haddon, Adv. Mater. 1998, 10, 379. (e) H. E. Katz, J. Mater. Chem. 1997, 7, 369. (f) A. Dodalabapur, L. Torsi, H. E. Katz, Science 1995, 268, 270.

[3] (a) H. Sirringhaus, P. J. Brown, R. H. Friend, K. Bechgaard, B. M. W. Lengeveld-Voss, A. J. H. Spiering, R. A. J. Janssen, E. W. Meijer, P. Herving, D. M. de Leeuw, Nature 1999, 401, 685. (b) G. Barbarella, M. Zambianchi, L. Antolini, P. Ostoja, P. Maccagnani, A. Bongini, E. A. Marseglia, E. Tedesco, G. Gigli, R. Cingolani, J. Am. Chem. Soc. 1999, 121, 8920. (c) J. H. Shön, C. Kloc, R. A. Laudise, B. Batlogg, Appl. Phys. Lett. 1998, 73, 3574.

[4] Handbook of Heterocyclic Chemistry; A. R. Katritzky Ed.; Pergamon Press: Oxford, 1983.

[5] (a) Y. Y. Lin, A. Dodabalapur, R. Sarpeshkar, Z. Bao, W. Li, K. Baldwin, V. R. Raju, H. E. Katz, Appl. Phys. Lett. 1999, 74, 2714. (b) G. Horowitz, Adv. Mater. 1998, 10, 365. (c) A. Dodalabapur, J. G. Laquindanum, H. E. Katz, Z. Bao, Appl. Phys. Lett 1996, 69, 4227. (d) N. C. Greenham, S. C. Moratti, D. D. C. Bradley, R. H. Friend, Nature 1993, 365, 628. (e) S. Sze, Semiconductor Devices Physics and Technology; Wiley: New York, 1985; p. 481.

[6] (a) C. P. Jarret, K. Pichler, R. Newbould, R. H. Friend, Synth. Met. 1996, 77, 35. (b) R. C. Haddon, J. Am. Chem. Soc. 1996, 118, 3041. (c) G. Horowitz, F. Kouki, P. Spearman, D. Fichou, C. Nogues, X. Pan, F. Garnier, Adv. Mater. 1996, 8, 242. (d) J. G. Laquindanum, H. E. Katz, A. Dodalabapur, A. J. Lovinger, J. Am. Chem. Soc. 1996, 118, 11331.

[7] The transport properties of metal/α,ω-dicyano-6HT/metal structures are highly metal/interface-dependent; TFT carrier signs and mobilities have not been reported: F. Demanze, A. Yassar, D. Fichou, Synthetic Metals 1999, 101 620.

[8] (a) B. Crone, A. Dodabalapur, Y. Y. Lin, R. W. Filas, Z. Bao, A. LaDuca, R. Sarpeshkar, H. E. Katz, W. Li, Nature 401, 521, (2000); (b) H. E. Katz, A. J. Lovinger, J. Johnson, et al., Nature 404, 478 (2000).

[9] (a) R. D. McCullough, Adv. Mat. 10, 93 (1998); (b) R. L. Pilston, R. D. McCullough, Synth. Met. 111, 433 (2000); (c) X. Hong, J. C. Tyson, J. S. Middlecoff, D. M. Collard, Macromolecules 32, 4232 (1999).

SUMMARY OF THE INVENTION

As shown from the above discussion, there are a considerable number of problems and deficiencies associated with the prior art relating to useful organic n-type semiconductor compounds, compositions and/or materials, including those discussed above. There is a demonstrated need for such materials, compositions, layers and/or composites for thin film deposition and related applications useful in conjunction with the fabrication of thin film transistors and related devices as can be incorporated into an integrated circuit.

Accordingly, it is an object of the present invention to provide new and useful n-type organic materials, together with one or more methods of preparation, overcoming those various shortcomings and deficiencies of the prior art.

It will be understood by those skilled in the art that one or more aspects of this invention can meet certain objectives, while one or more other aspects can meet certain other objectives. Each objective may not apply equally, in all instances, to every aspect of the present invention. As such, the following objects can be viewed in the alternative with respect to any one aspect of the present invention.

It is another object of the present invention to provide a facile, efficient synthetic method for the preparation of an n-type thiophene conductive material, such preparation resulting in high yield and purity of the desired thiophene material.

It is yet another object of the present invention to provide n-type semiconducting thiophene compounds and related materials and/or thin films which can be used in the fabrication of and in conjunction with a variety of circuitry related devices, including, but not limited to, diode, bipolar junction transistor and field-effect transistor (either junction or metal-oxide semiconductor) devices.

It is yet another object of the present invention to provide for the synthetic modification of organic semiconductive molecular solids to alter electronic behavior, in particular the use of such modified thiophenes to provide and facilitate electron transport.

Other objects, features, benefits and advantages of the present invention will be apparent from the foregoing, in light of the summary and the examples and descriptions which follow, and will be readily apparent to those skilled in the art having knowledge of various semiconducting materials, their preparation and subsequent use. Such objects, features, benefits and advantages will be apparent from the above as taken in conjunction with the accompanying examples, tables, graphs, data and all reasonable inferences to be drawn therefrom.

In accordance with one aspect of the present invention, one or more of the foregoing objects can be achieved by use of one or more of the thiophene compounds, compositions and/or materials of the type described herein, and/or with a suitable substrate material as part of a composite or a device incorporating such a composite.

In accordance with another aspect of the present invention, one or more of the preceding objects can be achieved with a method described herein, including the use of a thiophene material as an n-type semiconductor to transport electrons.

In accordance with another aspect of the present invention, one or more of the foregoing objects can be achieved with an organic thin film transistor device which includes a source electrode, a drain electrode and a semiconductor material between the electrodes, the material preferably comprising an n-type fluoroalkyl-substituted oligo- or polythiophene composition.

In accordance with yet a further aspect of the present invention, a method is provided by way of using the introduction of substituents to a semiconducting composition to alter charge conduction there through, such that a material which would otherwise be considered a p-type conductor becomes an n-type conductor through a synthetic transformation of the type described herein.

The present invention includes the first n-type thiophene semiconductor compositions and/or materials, for use with a variety of applications or devices including, but not limited to, organic TFTs. A preferred thiophene composition/material comprises α,ω-diperfluorohexylsexithiophene

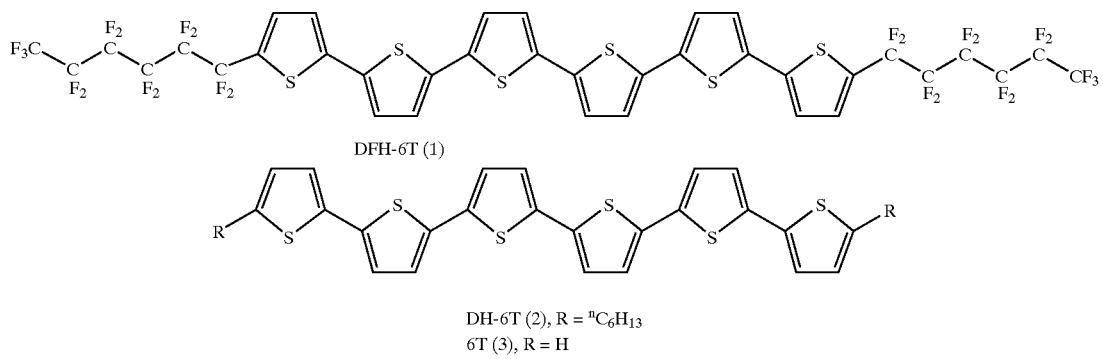

DFH-6T (1)

DH-6T (2), R = ⁿC₆H₁₃
6T (3), R = H designated as DFH-6T (1). Fluoroalkyl functionalization of a thiophene core significantly alters the electronic, film growth, and semiconducting properties of the resulting films.

The present invention contemplates a range of fluoroalkylated oligo- and/or polythiophene compounds, compositions and/or materials. Fluoroalkylation includes various alkyl chain lengths and fluoro-substitutions thereof, such as would result in an alteration of the electronic properties of the thiophene core from p-type to n-type semiconductivity. Without limitation, reference is made to the compositions embodied by the structural formulas and variations thereof shown in or inferred by Examples 9, 14 and 15 and claim 1, below. Known synthetic procedures can be used or modified as would be known to those skilled in the art made aware of this invention to provide a variety of thiophene cores, each with the appropriate fluoroalkyl substituents. However, for purposes such as processing and subsequent device fabrication, a preferred core has about 4–7 conjugated thiophene units. Likewise, $C_5$–$C_7$ fluoroalkyl substitution is preferred and can be accomplished using commercially-available reagents, but various other substitutions can be achieved through synthesis of the corresponding fluoroalkyl compounds. Thiophene core substitution is, therefore, limited only by the desired n-type semiconductivity.

A TFT device with, for instance, a DFH-6T active layer operates in the n-type accumulation mode, indicating DFH- 6T and other such thiophene compounds are n-type conductors. Compared to prior art materials such as DH-6T (2) and 6T (3), the new fluorinated thiophenes of this invention are significantly more chemically and thermally inert, and can be transported quantitatively into the vapor phase without decomposition. In the solid state, the inventive thiophene units have strong π—π intermolecular interactions. As described below, film growth morphologies can depend on growth temperature and substrate pretreatment and/or functionalization.

This invention demonstrates that fluoroalkyl side chain functionalization of a thiophene core significantly alters the semiconducting properties of a thiophene based conjugated oligomer or polymer material such that its conductivity switches from p-type (normally observed in unsubstituted or alkyl-substituted thiophene compounds) to n-type. This effect can be used to fabricate field-effect transistor devices that form electron accumnulation layers when a positive voltage is applied to the gate electrode. It is remarkable that the charge carrier mobility of the fluoroalkyl substituted n-type compounds is similar to that of the parent alkyl-substituted p-type compounds. Accordingly, the present invention can also include a method by which high mobility n-type semiconductors can be derived from high-mobility p-type semiconductors by replacing alkyl side chains with fluoroalkyl side chains.

Fluoroalkyl substitution substantially enhances thermal stability, volatility, and electron affinity vs. the non-fluoro analogs and affords the first n-type thiophene material composition/material for use, as an example, in a TFT. As a representative material of this invention, DFH-6T film morphology is sensitive to substrate temperature and surface pretreatment, with crystallite size increasing with increasing growth temperature. UV-vis/PL and XRD studies indicate that while DFH-6T has close intermolecular π-stacking, it is not isostructural with the DH-6T analog. Since thiophene oligomers of the prior art are typically p-type, the present invention using n-type semiconductors can provide a pathway by which an all-thiophene based complementary circuit can be realized.

In light of the preceding and with reference to the following figures and examples, the present invention is directed to a field effect transistor device including (1) a gate electrode and a semiconductor material in electrical contact therewith; (2) source and drain electrodes; and (3) an n-type semiconductor material between the source and drain electrodes and in electrical contact with, the material preferrably comprising a fluoroalkyl-substituted polythiophene composition. Such n-type polythiophene compositions include those described herein and/or claimed below. In preferred embodiments of this invention such polythiophene compositions have about four to about seven conjugated thiophene moieties and/or at least one $C_5$–$C_7$ fluoroalkyl substituents. Regardless, such compositions can be characterized by their electron affinities and/or field-effect mobilities through procedures and techniques well known to those skilled in the art made aware of this invention. For instance, in the preferred embodiments, such n-type polythiophene compositions have an electron affinity greater than about 3.0 eV. Various other preferred embodiments have electron affinities greater than about 4.0 eV, such affinities as can be modified for a particular end use application through choice and extent of fluoroalkyl substitution. Field-effect mobilities on the order of $10^{-3}$ cm$^2$/Vs and greater can be obtained depending upon choice of thiophene structure/substitution, composition/ material morphology and/or film growth conditions. See, for instance, Example 9, below. For example, a transistor device in accordance with this invention can be designed having a material with such an electron affinity and/or mobility, such properties as can be provided through choice of semiconductor composition and fluoroalkyl substitution, such choice and design as more fully described herein and/or as can be made to provide, more generally, such a composition/ material with n-type conductivity.

As indicated elsewhere herein, electrodes of such a field effect transistor, as well as those prepared for other transistor applications, can comprise a variety of materials well known to those skilled in the art, including gold. In preferred embodiments, such electrode materials are those useful in conjunction with the n-type semiconductor compositions described herein. In particular, such materials include but are not limited to silver and aluminum, having work functions less than about 5 eV.

In accordance with this invention, various transistor applications of the prior art are described in International Publication No. WO/9954936, the entirety of which is incorporated herein by reference. In particular, and as would be understood by those skilled in the art, a transistor of this invention can be used in conjunction with an active matrix display and/or used to switch the supply of current to a light-emissive device (LED). WO/9954936 discloses a configuration in which the drain electrode of a p-type transistor acts as the hole-injecting anode of the LED. Using n-type transistors as disclosed in the present invention, it is possible to fabricate active matrix LED displays in which the transistor acts as the cathode of the LED. When a supply voltage is connected between a source electrode of the transistor and the anode of the LED and a bias is applied to the gate electrode of the transistor, current flows from the source through the n-type thiophene semiconductor of the transistor to the drain electrode. The drain also acts as the cathode of the LED so the current then flows from the drain and through the light-emissive layer of the LED to the anode, causing light emission from the emissive layer. This configuration eliminates the need for using a reactive, low-work functional metal cathode, such as calcium or magnesium, and results in better environmental device stability.

In part, as described elsewhere herein, the present invention can also include a method of using a semiconductor material for n-type conduction in a transistor device, in particular a field effect transistor device. In preferred embodiments, such a method includes (1) providing a field effect transistor device having a gate electrode and a semiconductor material in electrical contact therewith; (2) providing source and drain electrodes with an n-type semiconductor material therebetween and in electrical contact therewith, the material comprising a fluoroalkyl-substituted polythiophene composition; and (3) operating the transistor via conduction with the polythiophene composition to provide a positive source-drain current. Application of a positive voltage to the gate electrode controls current conduction between source and drain electrodes. In various preferred embodiments, as available through use of the present invention, the gate semiconductor material can include a p-type polythiophene composition. With reference to the preceding discussion, the methodology of this invention can include operation of an associated transistor device in conjunction with a light emitting diode such that current injected into the diode can be controlled with suitable application of gate voltage. Alternatively, the n-type transistor devices of this invention can be used in combination with conventional p-type devices for the fabrication of complementary logic circuits, offering advantages of lower power consumption and better stability against variation of materials parameters, compared to all p-or all n-type logic circuits. Fabrication of complementary logic circuits requires patterning of the semiconducting layer, which can be achieved by shadow mask evaporation for oligomer materials as would be understood in the art. In the case of soluble n- and p-type materials patterning can also be achieved by known direct printing techniques such as screen printing, offset printing or inkjet printing.

EXAMPLES OF THE INVENTION

The following non-limiting examples and data illustrate various aspects and features relating to the thiophene compounds, composites, materials and related methods and devices of this invention, and demonstrate their surprising and unexpected utility in the transport of electrons (n-type). Comparably utilities and advantages can be realized using various other embodiments consistent with this invention.

Example 1

Figure 1:
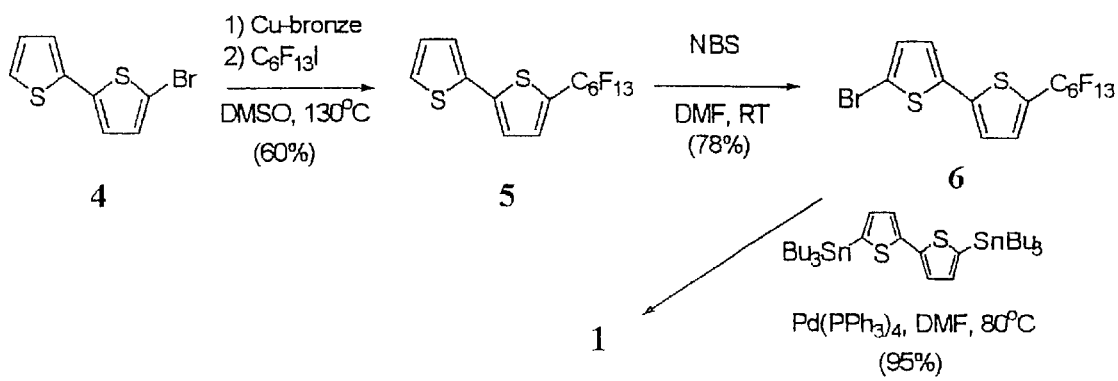
FIG. 1 shows schematically a synthetic procedure, in accordance with this invention, en route to a representative, but preferred n-type fluoroalkylthiophene material.

DFH-6T was synthesized in high yield via $Pd^0$-catalyzed Stille coupling of 5-bromo-5'-perfluorohexyl-dithiophene (6) with 5,5'-di(tributyl-stannyl)dithiophene (FIG. 1) This route affords DFH-6T (1) in high yield (~95%) and purity after multiple gradient sublimation. Note that although monosubstituted perfluoroalkyl thiophene oligomers up to three units have been reported, synthetic yields were typically ~10%. For example, 3'-perfluorohexylterthiophene was isolated in ~11% yield.

Example 2

Figure 2:
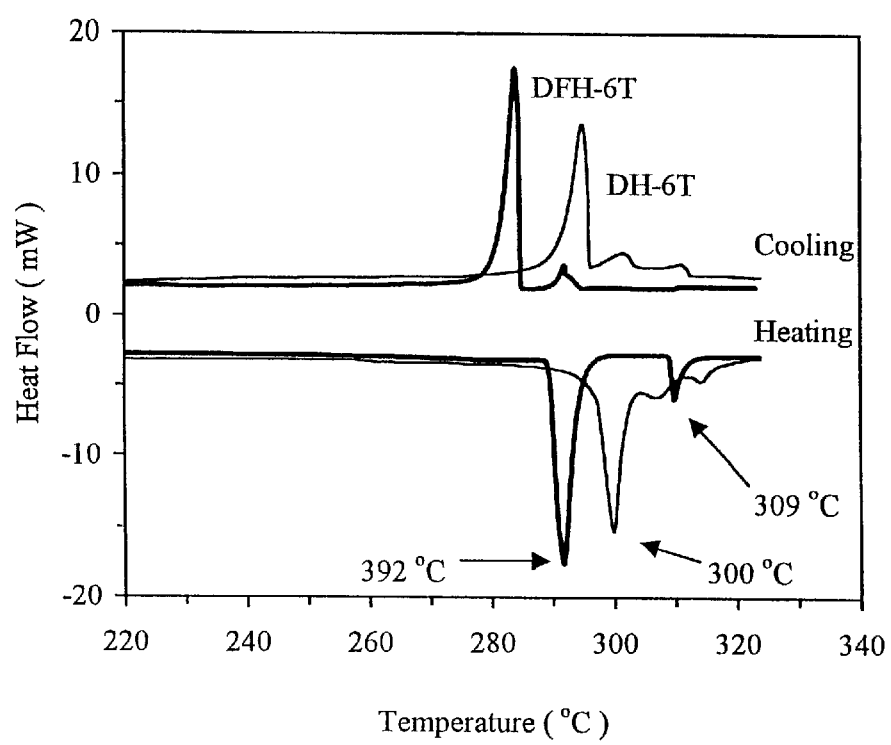
FIG. 2 shows DSC thermograms of DFH-6T (bold line) and DH-6T (fine line) under $N_2$. Temperature ramp=1.5° C./min.

The comparative thermal properties of DFH-6T (1) and DH-6T (2) were investigated by differential scanning calorimetry (DSC) and thermogravimetric analysis (TGA). In the DSC, both compounds exhibit at least one transition (FIG. 2). Compound 1 exhibits a distinct crystal-to-liquid crystal (LC) transition at 292° C. and a LC-to-isotropic transition at 309° C., while the literature shows that the crystal-to-LC transition of 2 (300° C.) falls just below the melting point, 308–313° C. These mesophase formation events are not surprising in view of the molecular architectures. However, the most interesting feature is that the two systems exhibit such similar thermal behavior and almost identical melting points, suggesting that strong DH-6T π—π interactions are preserved upon fluorine substitution.

Example 3

Figure 3:
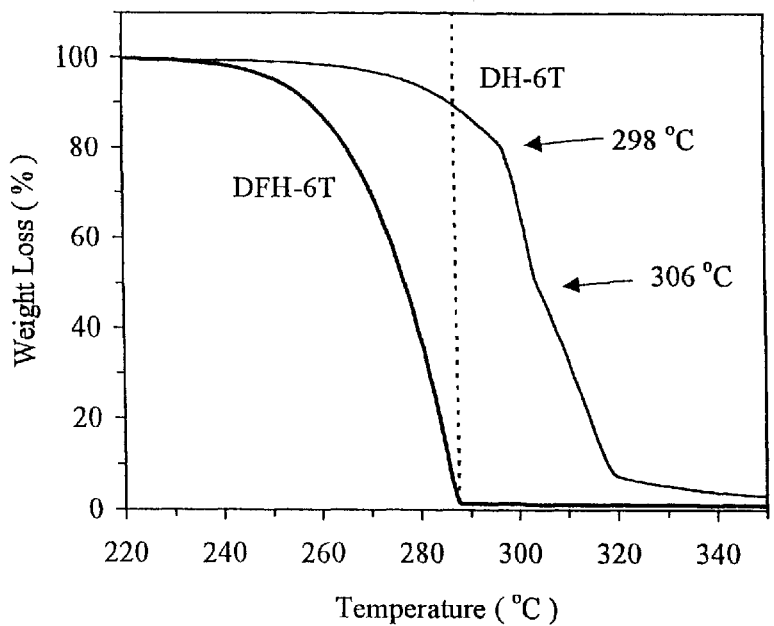
FIGS. 3A–B show reduced pressure (0.01 torr $N_2$) TGA comparison of the volatility characteristics of DHF-6T and DH-6T: weight loss comparison plots (A) for DH-6T and DFH-6T recorded at a ramp rate of 1.5° C./min; and isothermal data (B) collected at 260 and 290° C. for DFH-6T and DH-6T, respectively.
Figure 3:
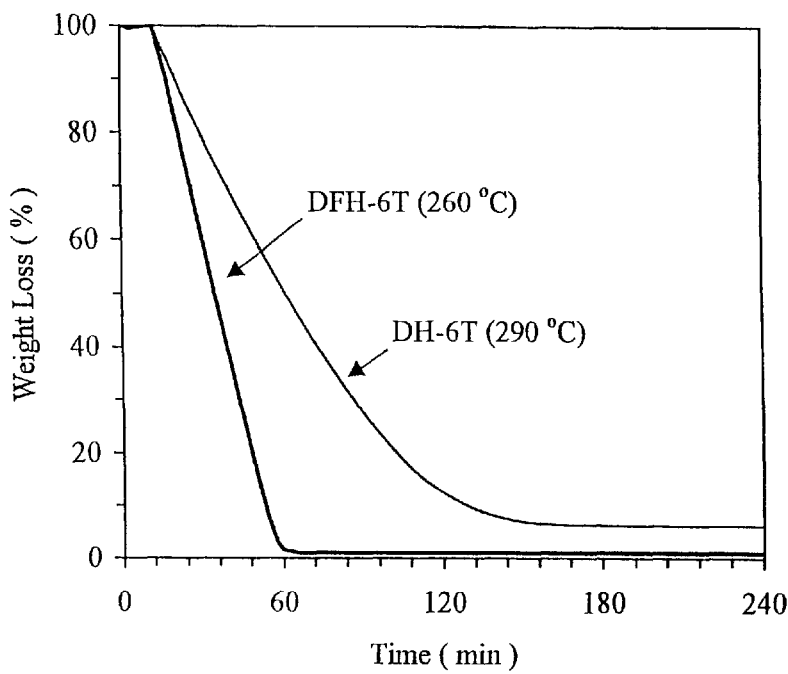

In contrast, the α,ω-fluorocarbon chains have a dramatic effect on the volatility of 1 as shown by TGA (FIG. 3A). The monotonic % weight loss vs. T demonstrates smooth, clean, quantitative sublimation well below the melting point with negligible residue. In contrast, DH-6T (2) exhibits significant volatility only above the melting point, with the TGA data revealing inflections at ~298 and ~306° C., suggesting decomposition processes. In addition, a significant decomposition-related residue (~6%) is observed at 320° C. The enhanced volatility of DFH-6T (vs. DH-6T) is further demonstrated by isothermal TGA (FIG. 3B) where DH-6T sublimation at the lowest possible temperature leaves ~8% decomposition residue.

Example 4

Figure 4:
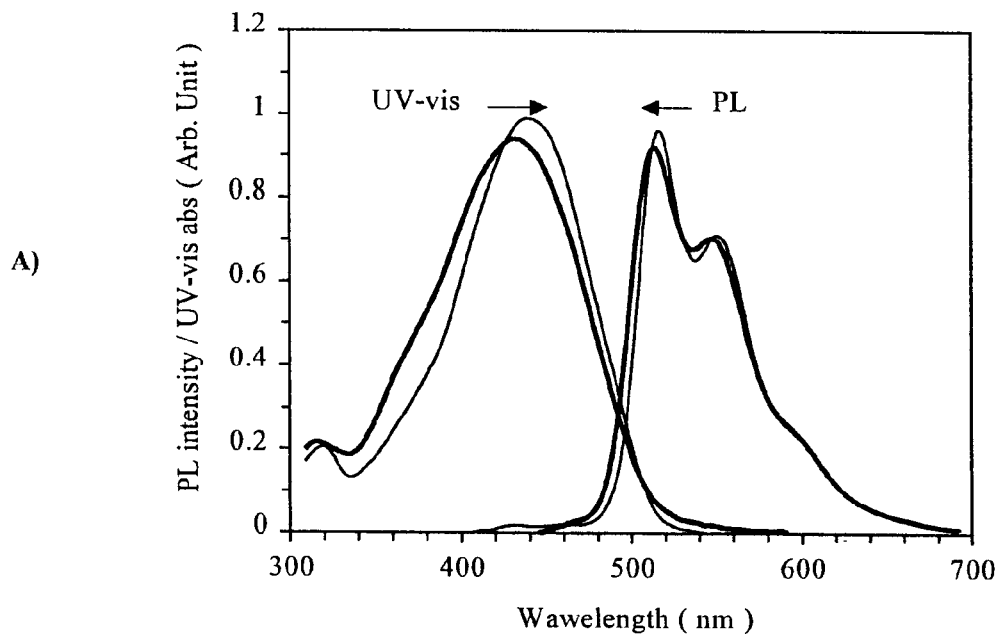
FIGS. 4A–B show optical absorption (UV-vis) and emission (PL) spectra of DFH-6T (bold line) and DH-6T (fine line): (A) dilute toluene solution at ca. 80° C., solution PL excited at 444 nrn (DFH-6T) and 436 rim (DH-6T); and (B) as thin films (~1.8 μm) on glass substrates, film PL spectra excited at 377 nm (DFH-6T) and 363 nm (DH-6T).
Figure 4:
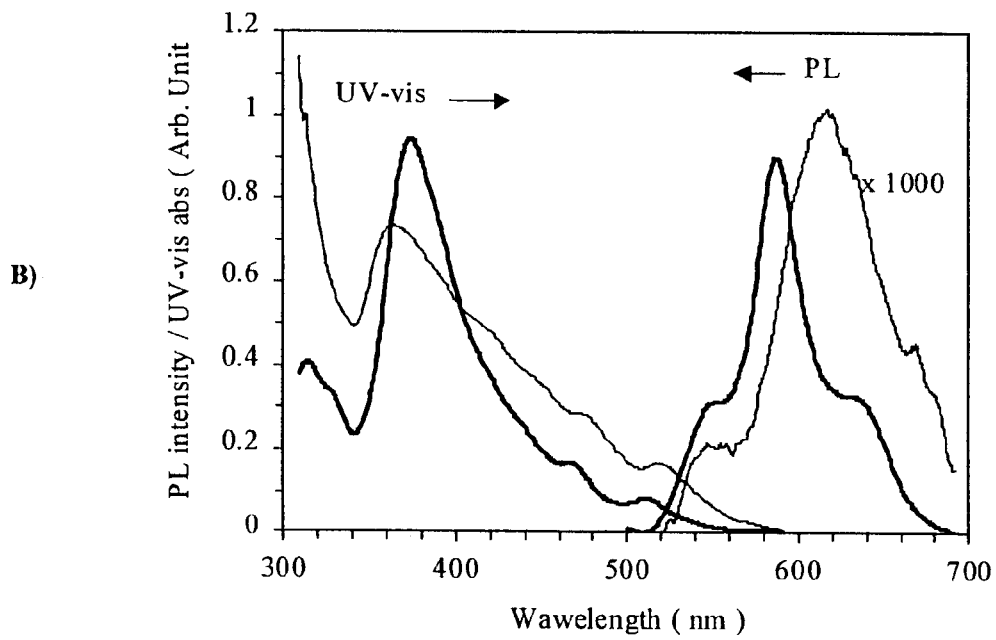

FIG. 4 shows optical absorption and emission (PL) spectra of DFH-6T and DH-6T in solution (FIG. 4A) and as thin vapor-deposited films (FIG. 4B). Remarkably, the solution spectra are nearly superimposable, arguing that the energy differences between ground and excited states of the 6T core are only marginally sensitive to α,ω-substitution and that the HOMO-LUMO gaps of ~2.4 eV are nearly identical. The spectra of the films exhibit both differences and similarities. First, both PL spectra have a central peak and two weaker shoulders. The high energy shoulders fall, for both systems, at the same wavelength near the tail of the absorption, yielding estimated film HOMO-LUMO gaps of ~2.2 eV. However, while DFH-6T exhibits strong green fluorescence ($\lambda_{max}$~588 nm) under UV excitation, the DH-6T emission intensity is several orders of magnitude weaker and red-shifted by ~30 nm. The low PL yields of the prior art DH-6T (2) and 6T (3) thin films and blue-shifted absorption maxima vs. solution were previously ascribed to Davydov splitting. The origin of the DFH-6T blue-shifted absorption and enhanced PL efficiency is unknown and warrants further study. While both DH-6T and DFH-6T exhibit strong intermolecular π—π interactions, they are not isostructural (vide infra).

Example 5

The electronic consequences of DH-6T fluoroalkyl substitution were also investigated by cyclic voltammetry (one-compartment cell with a Pt working electrode, Ag/0.1M $AgNO_3$ ($CH_3CN$) reference, Ag counter electrodes). The $Ag/AgNO_3$ reference electrode was calibrated against ferrocene/ferrocinium ($E_{1/2}$=0.042 V). Voltammograms of DFH-6T and DH-6T in $CHCl_3$/0.10M $TBABF_4$ exhibit two chemically irreversible oxidative waves at +0.68/+0.88 V and +0.41/+0.61 V, respectively, and negligible reductive features, indicating chemically irreversible oxidative processes likely related to polaron and bipolaron formation. The first and second anodic peaks of DFH-6T vs. DH-6T exhibit a uniform anodic potential shift (~+0.27 V), indicating that introduction of perfluoroalkyl chains on the 6T core substantially increases the ionization potential. The similar HOMO (highest occupied molecular orbital)-LUMO (lowest unoccupied molecular orbital) gaps of the two compounds indicate that the LUMO of DFH-6T is also approximately −0.27 eV below that of DH-6T. This increase in electron affinity is thought responsible for the stabilization and reduced trapping of electron carriers and n-type conductivity in DFH-6T compared to DH-6T.

Example 6

Figure 5:
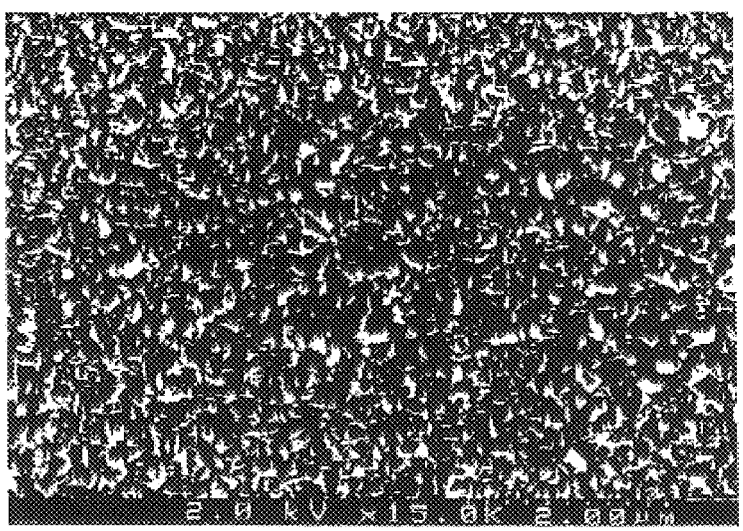
FIGS. 5A–C provide plan view SEM images of 100 nm thick DFH-6T films deposited at various substrate temperatures on silicon: (A) 25° C., (B) 85° C., and(C) 145° C.
Figure 5:
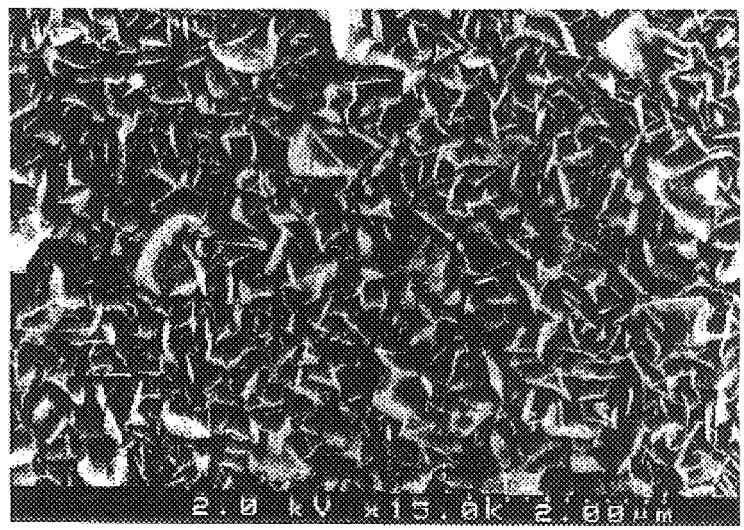
Figure 5:
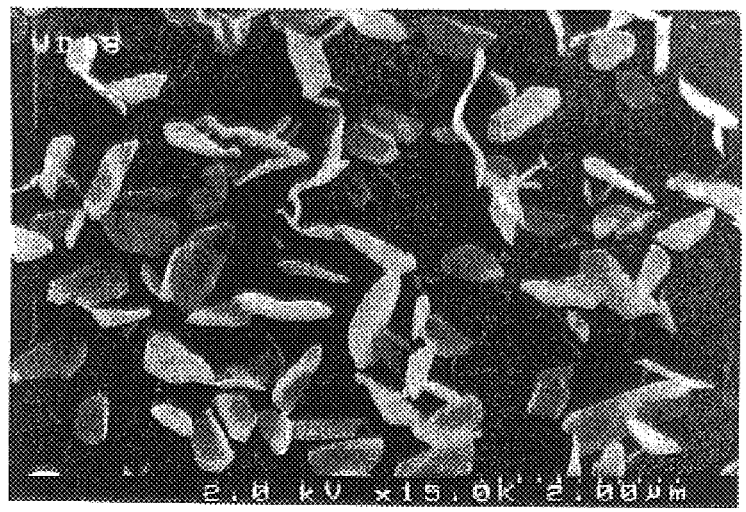

SEM reveals DFH-6T film growth depends significantly on substrate temperature and surface pretreatment. Films deposited at 25° C. consist of small crystalline grains (~80×50 nm$^2$) resulting from rapid condensation on the cold substrate (FIG. 5A), while growth at 85° C. (FIG. 5B) affords elongated grains with larger dimensions (~500×60 nm$^2$) and random orientation. Growth at 145° C. yields larger crystallites (FIG. 5C: ~1000×350 nm$^2$), however film morphology is less smooth, probably because DFH-6T volatility prevents uniform adsorption on the hot surface. The influence of substrate temperature on crystallite size and film morphology for other thiophene semiconductors such as 6T (3) is known to be related to nucleation site density, growth rate, and surface free energy phenomena during growth. Because Si/SiO$_2$ has a hydrophilic native oxide layer, the surface is not ideal for deposition of a hydrophobic adsorbate. Thus, substrates were also pretreated with CF$_3$(CF$_2$)$_5$CH$_2$CH$_2$SiCl$_3$ to produce a fluorocarbon monolayer. The crystallite dimensions are increased by ~10% and grain-to-grain, grain-to-substrate interconnections are visibly enhanced. Various other substrate materials known to those skilled in the art can be used in conjunction with this invention, not only to further demonstrate the utility shown in this example, but also in the various composites and electronic devices described elsewhere herein.

Example 7

Figure 6:
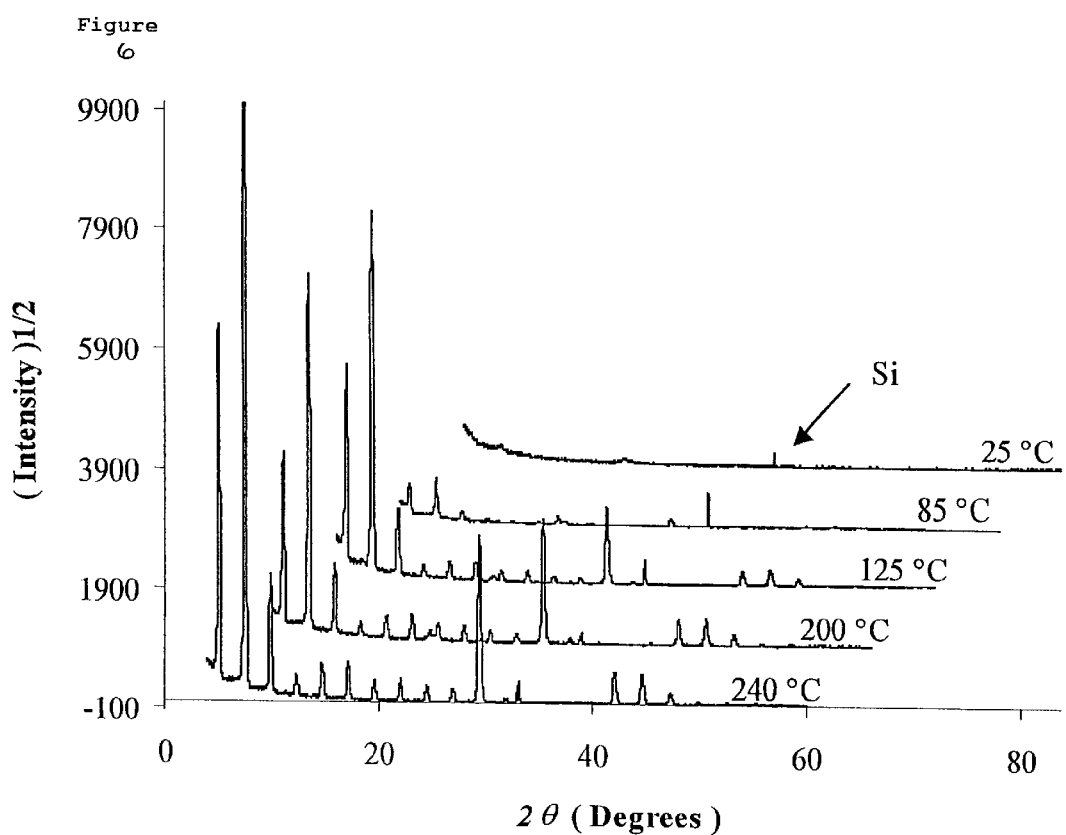
FIG. 6 provides X-ray θ–2θ diffractograms of ~2 μm thick vacuum-evaporated DFH-6T films grown on Si substrates at various substrate temperatures. Note that the 240° C. spectrum corresponds to a film grown at 200° C. and annealed at 240° C. for 30 min.

X-ray diffraction (Cu K$_\alpha$) scans of DFH-6T films grown at various temperatures (FIG. 6) reveal that higher crystalline order is achieved as the substrate temperature is increased to 200° C. Annealing at 240° C. further enhances microstructural alignment, with the dominant Bragg features assignable to a family of (n00) reflections corresponding to a real-space periodicity of 36.1±0.2 Å, close to the DFH-6T long axis dimension. Although the crystal structure of DFH-6T has not been determined, the XRD data suggest preferential molecular orientation with long axes along the substrate normal, in which case transport in the plane of the film would benefit from close π—π stacking. Note that DFH-6T films grown on CF$_3$(CF$_2$)$_5$CH$_2$CH$_2$SiCl$_3$-treated Si substrates exhibit sharper XRD reflections, indicating highly ordered films. Finally, powder diffraction reveals that DFH-6T and DH-6T are isostructural, with different unit cell arrangements expected in view of the different packing properties of hydrocarbon vs. perfluorocarbon chains.

Example 8

Demonstrating use of the present invention in conjunction with a thin film as part of a field effect transistor (FET), field-effect measurements were carried out on top contact TFTs with 30–100 nm DFH-6T films deposited at <10$^{-6}$ mbar and at ~0.5–1.0 Å/s onto n$^+$-Si FET substrates with a 230 nm dry thermal SiO$_2$ insulating layer. The substrate temperature was varied between 50° C. -120° C. Prior to DFH-6T deposition, the SiO$_2$ surface was silylated with hexamethyldisilazane or CF$_3$(CF$_2$)$_5$CH$_2$CH$_2$SiCl$_3$; both yielded similar TFT results. The devices were completed by evaporating Au or Al source-drain contacts on the DFH-6T. Device characteristics were measured under N$_2$ with an HP parameter analyzer. FIG. 7(a) shows characteristics of a typical DFH-6T FET with Au S-D contacts (channel length L=75 μm, channel width W=1.5 mm). Transistor action is observed only for positive gate voltages ($V_g$>0) indicating an accumulation layer of mobile electrons is formed at the DFH-6T-SiO$_2$ gate dielectric interface. No transistor action is induced by applying a negative gate voltage. Previously, only p-type accumulation ($V_g$<0) has been observed in TFTs of alkyl-substituted and unsubstituted oligo- and polythiophene derivatives. The positive signs of both gate voltage ($V_g$) and source drain current ($I_d$) show that DFH-6T is a new n-type semiconductor. The present n-type conduction doubtless reflects the greater electron affinity of the fluoro alkyl-substituted sexithiophene.

It is remarkable, surprising and unexpected that this relatively minor substituent-related change is sufficient to dramatically alter thin-film semiconducting properties from p- to n-type. The only other example of such a majority carrier sign inversion is the unrelated phthalocyanine→perfluorophthalocyanine system. However, DFH-6T and M(F$_{16}$Pc) differ markedly in the nature of substituent effects, and the inversion observed here would not be expected. In the M(F$_{16}$Pc) system, extensive C—H→C—F substitution leads to a large electronic perturbations of the core structure. Furthermore, the nature of the substituents differs. Whereas perfluoroalkyl chains exhibit only strong σ-inductive electron-withdrawing effects (−I), F atoms attached directly to π-systems exhibit both donating-resonance (+R) and attracting-inductive (−I) characteristics.

Example 9

Figure 7:
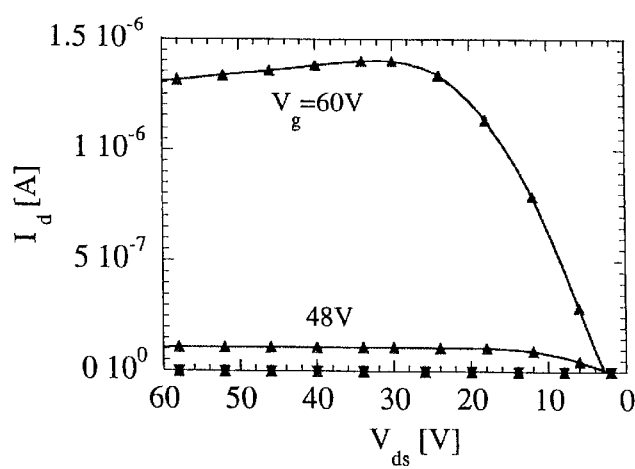
FIGS. 7A–B plot graphically (A) source drain current vs. voltage characteristics of DFH-6T TFTs (top contact configuration) at different gate voltages, and (B) source drain current vs. gate of DFH-6T TFTs.
Figure 7:
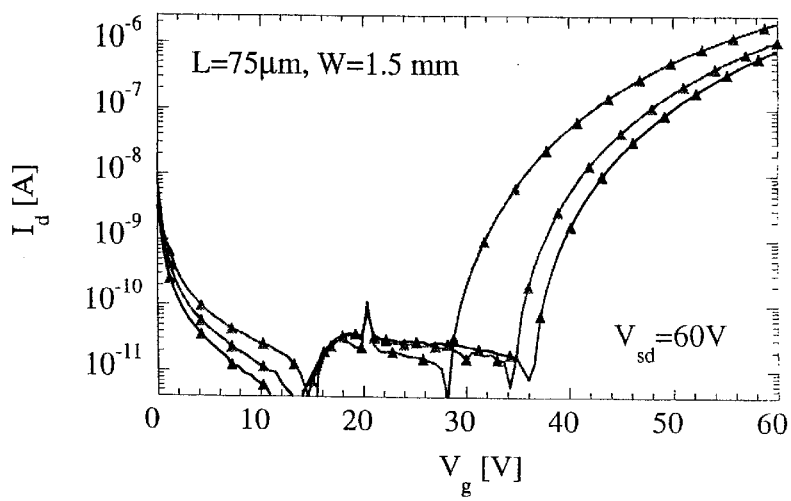

The device of FIG. 7 was fabricated with Au source-drain contacts. Devices with Al contacts exhibit similar characteristics, which is surprising considering the significantly higher Au work function (5.1 eV) vs. Al (4.3 eV), implying, a priori, a higher barrier for electron injection from Au. Values for the field-effect mobility were determined from the transfer characteristics in the saturation regime (FIG. 7b). The highest mobilities of 0.02 cm$^2$/Vs $$\frac{dI_d}{dV_g} = \frac{C_i \cdot W}{L} \cdot \mu_{FET}^{sat}(V_g) \cdot (V_g - V_T)$$

were obtained for film growth at 80–100° C. For growth temperatures ~50°, significantly lower mobilities (<10$^{-4}$ cm$^2$/Vs) are observed, and for temperatures ~120° C., a reduced mobility is obtained. This optimum substrate temperature doubtless reflects, among other factors, the grain size distribution temperature dependence in the polycrystalline film. The on/off ratio in these DFH-6T devices is as high as 10$^5$. The devices exhibit relatively high turn-on voltages $V_o$ of 25–35V, indicating a certain fraction of the induced electron carriers occupies localized trap states. The turn-on voltage increases further during operation. This results in a decrease of the TFT ON-current as a function of time which manifests itself in a non-ideal negative slope of the output characteristics in the saturation regime (FIG. 7(a)). The turn-on-voltage can be somewhat reduced and stabilized by post-growth annealing (FIG. 7(b)). The limited operating stability of the device is believed to reflect trapping of electrons by residual impurities and structural defects. The stability can be enhanced by further increasing the electron affinity of the semiconducting material for example by increasing the number of fluoroalkyl substituents attached to the thiophene core. This can be achieved by the fluoroalkyl substitution of the β-positions of oligo- or polythiophene polymer (n>10) resulting in an analogous increase of the electron affinity. The electron affinity may be fine-tuned by using side chains of the composition $C_nH_{2n}C_mF_{2m+1}$ with n=0 or n=1, and $4 \leq m \leq 12$ being preferred compositions, as shown below. Side chains in the β-positions are preferably attached in a regioregular head-to-tail arrangement in order to reduce steric torsions of the backbone and achieve a high charge carrier mobility[3a]. General synthetic methods useful with this invention are described in the prior art or as otherwise provided herein.[9]

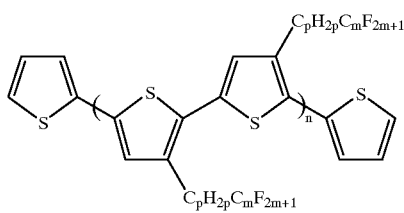

The methodology of this invention to achieve n-type conductivity by fluoroalkyl side chain substitution can be applied to other conjugated oligomers and polymers, that normally exhibit p-type conductivity. Examples of such materials include oligomers and polymers based on aromatic units other than thiophene, such as but not limited to furan, phenylene, pyrrole or pryrazine, and their derivatives.

Example 10

The reagents 5-bromo-2,2'-dithiophene (4), and 5,5 '-bis(tri-n-butylstannyl)-2,2'-dithiophene were prepared according to known synthetic procedures. Other solvents and reagents were purchased from the Aldrich or Lancaster concerns and purified as required.

Example 11

5-Perfluorohexyl-2,2'-dithiophene (5)

A suspension of Cu bronze (3.38 g, 53.16 mmol) in dry DMSO (30 mL) was heated at 125° C. for 15 min under nitrogen. Perfluorohexyl iodide (11.34 g, 25.43 mmol) was added dropwise in such a way as to keep the temperature below 135° C. After 45 min, a solution of 5-bromodithiophene (2.50 g, 10.17 mmol) in the same solvent (7.0 mL) was added dropwise, and the reaction mixture was stirred at 125° C. for 16 h. The reaction was next quenched with cold water (100 mL) and diethyl ether was added (200 mL). After shaking, the mixture was filtered through Celite and the organic phase collected. The aqueous layer was extracted once more with ether (100 mL) and the two organic phases were combined, washed with water, and dried over $MgSO_4$. After filtration, the solvent was evaporated to yield a solid (5.18 g) which was chromatographed on silica gel (hexane) to afford pure product as a yellow solid (2.90 g, 5.99 mmol, 58.9% yield). M.p. 51–53° C. (MeOH); $^1$H NMR ($CDCl_3$): δ 7.31–7.37 (2H, m), 7.28 (1H, d, $^2$J=3.6), 7.18 (1H, d, $^2$J=3.7), 7.06 (1H, dd); $^{19}$F NMR ($CDCl_3$): δ −81.07 (3F), −101.64 (2F), −121.83 (4F, broad), −123.11 (2F), −126.43 (F). Anal. Calcd for $C_{14}H_5F_{13}S_2$: C, 34.72; H, 1.04; F, 51.00. Found: C, 34.96; H, 0.99; F, 49.95; HRMS (EI, 70 eV): found m/z 483.9626, calcd for $C_{14}H_5F_{13}S_2$ ($M^+$) 483.9625.

Example 12

5-Perfluorohexyl-5'-bromo-2,2'-dithiophene (6)

With exclusion of light, NBS (1.02 g, 5.73 mmol) was added to a solution of 5-perfluorohexyldihiophene (2.32 g, 4.79 mmol) in DMF (32 mL). After stirring overnight at 25° C., the reaction mixture was poured into brine (120 mL), and the solution then extracted with ether (3×100 mL). The organic phase was next washed with water, dried over $MgSO_4$, filtered, and the solvent evaporated to afford 2.60 g of crude product. Flash chromatography on silica gel (hexane) afforded the title compound as a light yellow solid (2.10 g, 3.73 mmol, 77.8% yield). Sublimation (50° C./$10^{-3}$ Torr) afforded a purer sample. M.p. 63–65° C.; $^1$H NMR ($CDCl_3$) δ 7.34 (1H, d,), 7.12 (1H, d, $^2$J=3.1), 7.03 (1H, d, $^2$J=3.3), 7.01 (1H, d); $^{19}$F NMR ($CDCl_3$) δ −81.07 (3F), −101.64 (2F), −121.83 (4F, broad), −123.11 (2F), −126.43 (2F). $^{19}$F NMR ($CDCl_3$) δ −81.21 (3F), −101.87 (2F), −122.02 (4F, broad), −123.27 (2F), −126.56 (2F). Anal. Calcd for $C_{14}H_4BrF_{13}S_2$: C, 29.86; H, 0.72; F, 43.86, Found: C, 29.83; H, 0.69; F, 44.01; HRMS (EI, 70 eV): found m/z 563.8721, calcd for $C_{14}H_4BrF_{13}S_2$ ($M^+$) 563.8709.

Example 13

α,ω-Diperfluorohexyl-sexithiophene (1)

A mixture of 5,5'-bis(tri-n-butylstannyl)-2,2'-dithiophene (1.40 g, 1.88 mmol), 5-perfluorohexyl-5'-bromo-2,2'-dithiophene (2.00 g, 3.55 mmol) and $Pd(PPh_3)_4$ (0.050 g, 0.040 mmol) in dry DMF (40 mL) was deareated twice with nitrogen. The reaction mixture was then heated at 80° C. for 7 h during which time a precipitate formed. After cooling, the bright orange solid was collected and washed several times with hexane, methanol, and acetone to afford the analytically pure product (1.91 g, 1.69 mmol, 95.2% yield). M.p. 309° C. Additional purification can be achieved by gradient sublimation. Anal. Calcd for $C_{36}H_{12}F_{26}S_6$: C, 38.24; H, 1.07; F, 43.69. Found: C, 38.16; H, 1.15; F, 43.42. MS (EI, 70 eV) 1127.4 ($M^+$, 70%).

Example 14

With reference to structure 7, below, the compounds of this example further illustrate the thiophene compositions, materials and/or films of the type available through this invention. (X is a functional group of the sort described in Example 15, and a=0–12.)

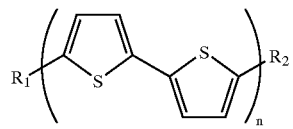

7

| | N | $R_1$ | $R_2$ |
|---|---|---|---|
| 7a | 1 | $C_6F_{13}$ | $C_6F_{13}$ |
| 7b | 1.5 | $CF_3$ | $C_2H_4X$ |
| 7c | 3 | $C_4H_9$ | $CF_3$ |
| 7d | 4 | $C_3F_7$ | $(CH_2)_aX$ |
| 7e | 5–6 | $C_2F_5$ | $C_8F_{17}$ |

Example 15

In general, the oligo-and/or polythiophene compounds of this invention including those of and represented by the preceding example are prepared in accordance with the synthetic procedures of this example and straight-forward modifications thereof. Substitution of 5-halo-2,2'-dithiophene with a suitable fluorocarbon provides one intermediate (a). Alteratively, the monohalodithiophene can be halogenated through known techniques for subsequent fluorocarbon substitution at both the 5 and 5' positions, such a dithiophene for use as described herein, as an n-type semiconducting material.

Yet another embodiment of this example contemplates substitution at the 5' position, and fluoroalkylation at the 5 position to provide a second intermediate (b). The 5' substituent introduces an aromatic or alkyl moiety including but not limited to amino, hydroxyl and/or carboxylic functional groups for later possible synthetic transformation. Intermediates (a) and/or (b) of this example are coupled with a stannyl (mono- or -bis-) thiophene (mono- or -di-), or further reacted with another intermediate of the type described herein to provide a range of conjugated thiophene units, with the desired degree of fluoroalkylation and/or alternate functionalization.

Example 16

Figure 8:
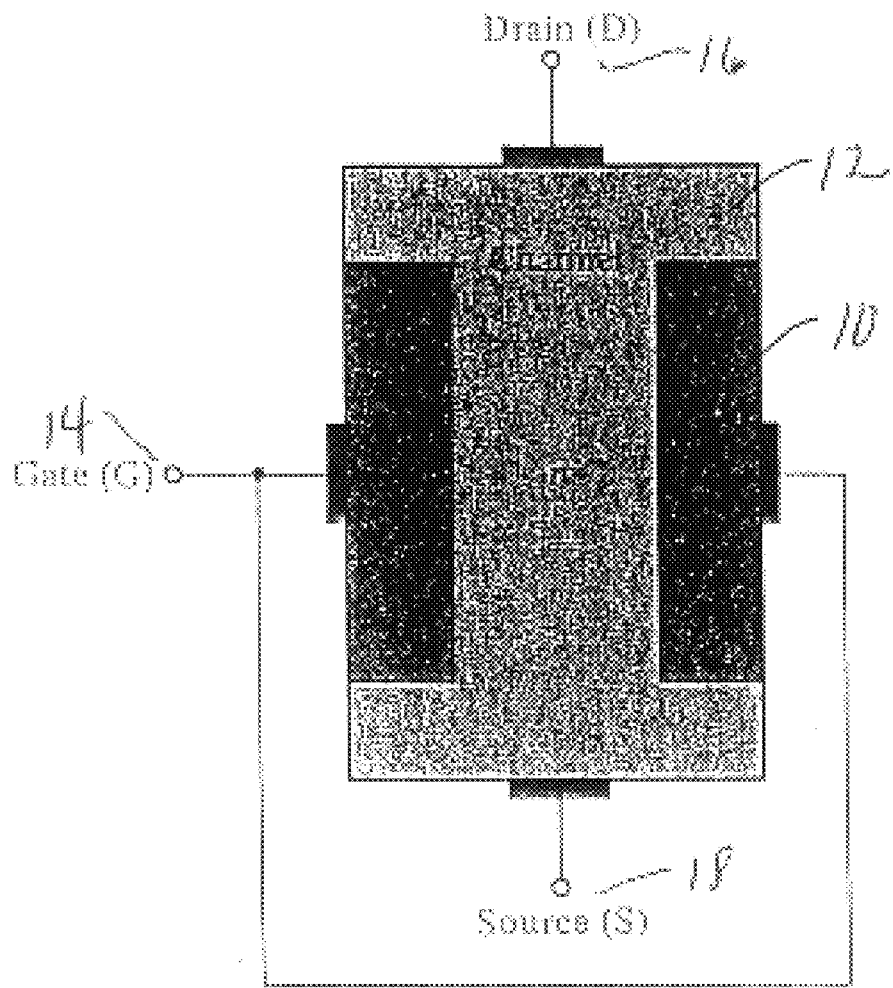
FIG. 8 schematically illustrates several transistor and related integrated circuit devices including therein, in accordance with this invention, a polythiophene thin film of the type described herein.

FIG. 8 illustrates incorporation of a thiophene semiconductor material of the present invention in an n-channel junction field-effect transistor (JFET). The JFET includes a gate region 10 constructed from a p-type semiconductor material and a channel 12 constructed from an n-type thiophene thin film deposited on a suitable substrate. (As mentioned above, the material of region 10 can be a p-type thiophene semiconductor.) In this device, a voltage applied to a gate electrode 14 controls current flow through the thin film/substrate composite of channel 12 between the drain electrode 16 and the source electrode 18. One of ordinary skill in the art can similarly apply a thiophene material of the present invention in a number of other transistor applications to provide without limitation p-channel JFETs, bipolar junction transistors of both the npn and pnp type, depletion and enhancement mode MOSFETS of both n and p channel types, and other types of transistors and integrated circuits.

While the principles of this invention have been described in connection with specific embodiments, it should be understood clearly that the summary and descriptions herein, along with the chosen tables, graphs and data provided, are made only by way of example and are not intended to limit the scope of this invention in any manner. For example, a variety of the thiophene materials, of the type described herein, can be utilized as thin films incorporated into a wide range of electronic devices. Such devices and any related circuitry can be fabricated using complementary (n-type and p-type) thiophene materials. Other advantages and features of this invention will become apparent from the foregoing and any claims made thereto, with the scope thereof determined by the reasonable equivalents, as would be understood by those skilled in the art.

What is claimed:

1. A field effect transistor device, comprising:
   a gate electrode;
   a source electrode and a drain electrode; and
   an n-type conjugated organic semiconducting material between said source and drain electrodes and in electrical contact therewith, comprising at least one side chain that contains a fluoroalkyl group.

2. The field effect transistor device of claim 1 wherein said fluoroalkyl group is covalently attached to one of the conjugated units of the n-type organic semiconducting material.

3. The field effect transistor device of claim 1 wherein said n-type organic semiconducting material contains about four to about seven conjugated thiophene moieties.

4. The field effect transistor device of claim 3 wherein said n-type organic semiconducting material is di-substituted and at least one of said substituents comprises a fluoroalkyl moiety.

5. The field effect transistor device of claim 4 wherein said fluoroalkyl moiety is a $C_5 F_7$ fluoroalkyl substituent.

6. The field effect transistor device of claim 1 wherein said n-type organic semiconducting material is a polythiophene polymer with more than seven conjugated thiophene moieties.

7. The field effect transistor of claim 6, where said polythiophene polymer contains fluoroalkyl substituents attached to the 3-position of the thiophene rings in a regioregular, head-to-tail configuration.

8. The field effect transistor of claim 7, where said polythiophene polymer is regioregular, head-to-tail poly-3-$C_n F_{2n+1}$-thiophene.

9. The field effect transistor of claim 7, wherein said polythiophene polymer is regioregular, head-to-tail poly-3-$C_m H_{2m+1} C_n F_{2n+1}$-thiophene.

10. A field effect transistor device of claim 1 wherein each of said source and drain electrodes have a work function less than about 5 eV.

11. The field effect transistor device of claim 10 wherein said electrodes comprise a material selected from the group consisting of silver and aluminum.

12. The field effect transistor device of claim 1 wherein said n-type semiconducting organic material has an electron affinity greater than about 3.0 eV.

13. The field effect transistor device of claim 12 wherein said electron affinity is greater than about 3.5 eV.

14. The field effect transistor device of claim 13 wherein said electron affinity is greater than about 4.0 eV.

15. The field effect transistor device of claim 1 further comprising a substrate with said n-type semiconducting material composition as a thin film thereon.

16. A field effect transistor device of claim 1 wherein said transistor is a thin film transistor.

17. A field effect transistor device of claim 1 wherein said transistor is a junction field-effect transistor.

18. The field-effect transistor of claim 17 wherein said gate electrode is in electrical contact with a p-type thiophene-based organic semiconductor.

19. A field-effect transistor device of claim 1 wherein said transistor is a pnp transistor.

20. A field-effect transistor device of claim 1 wherein said transistor is a npn transistor.

21. The organic transistor device of claim 1 wherein said n-type organic semiconducting material is in contact with a substrate coated with a fluorocarbon material.

22. The transistor device of claim 1 wherein said transistor is part of an integrated circuit.

23. A complementary logic circuit containing organic transistor devices as in any of the preceding claims.

24. An active matrix display containing an organic transistor device of claim 1.

25. An active matrix LED display containing an organic transistor device of claim 1.

26. A method of using an organic semiconductor material for n-type conduction in a field effect transistor, said method comprising:
   providing a field effect transistor device having a gate electrode;
   providing source and drain electrodes with an n-type semiconductor material therebetween and in electrical contact therewith, said n-type semiconductor material comprising a fluoroalkyl-substituted composition; and operating said transistor for conduction with said composition to provide a positive source-drain current.

27. The method of claim 26 wherein a positive voltage is applied to said gate electrode to control conduction between said source and drain electrodes.

28. The method of claim 27 wherein the said gate electrode is in electrical contact with a p-type organic semiconductor.

29. The method of claim 28 wherein said n-type and p-type organic semiconductor materials are of polythiophene composition.

30. The method of claim 26 wherein said drain electrode is in electrical contact with a light emitting diode and said current injects electron into said diode, said applied gate voltage controlling said injection.

31. A complementary organic transistor circuit containing n- and p-type transistors in which the chemical structure of the n-type semiconducting material differs from that of the p-type semiconducting material only by the replacement of at least one alkyl side chain by a fluoroalkyl side chain.

32. A junction field-effect transistor in which the chemical structure of the n-type semiconducting material differs from that of the p-type semiconducting material only by the replacement of at least one alkyl side chain by a fluoroalkyl side chain.

* * * * *

UNITED STATES PATENT AND TRADEMARK OFFICE
CERTIFICATE OF CORRECTION

PATENT NO. : 6,608,323 B2
DATED : August 19, 2003
INVENTOR(S) : Tobin J. Marks et al.

It is certified that error appears in the above-identified patent and that said Letters Patent is hereby corrected as shown below:

<u>Column 7,</u>
Line 25, "nrn" should be -- nm --
Line 25, "rim" should be -- nm --

<u>Column 11,</u>
Line 9, "≦" should be -- ≤ -- (two instances)

Signed and Sealed this

Sixteenth Day of December, 2003

JAMES E. ROGAN
*Director of the United States Patent and Trademark Office*